US010023977B2

(12) United States Patent
Zhang et al.

(10) Patent No.: US 10,023,977 B2
(45) Date of Patent: Jul. 17, 2018

(54) METHOD FOR PRODUCING HIGH STACKING FAULT ENERGY (SFE) METAL FILMS, FOILS, AND COATINGS WITH HIGH-DENSITY NANOSCALE TWIN BOUNDARIES

(71) Applicants: Xinghang Zhang, College Station, TX (US); Daniel Bufford, College Station, TX (US); Haiyan Wang, College Station, TX (US); Yue Liu, College Station, TX (US)

(72) Inventors: Xinghang Zhang, College Station, TX (US); Daniel Bufford, College Station, TX (US); Haiyan Wang, College Station, TX (US); Yue Liu, College Station, TX (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 532 days.

(21) Appl. No.: 14/428,538

(22) PCT Filed: Sep. 17, 2013

(86) PCT No.: PCT/US2013/060164
§ 371 (c)(1),
(2) Date: Mar. 16, 2015

(87) PCT Pub. No.: WO2014/043701
PCT Pub. Date: Mar. 20, 2014

(65) Prior Publication Data
US 2015/0233019 A1    Aug. 20, 2015

Related U.S. Application Data

(60) Provisional application No. 61/702,115, filed on Sep. 17, 2012.

(51) Int. Cl.
*C30B 29/68* (2006.01)
*C30B 29/02* (2006.01)

(52) U.S. Cl.
CPC .............. *C30B 29/68* (2013.01); *C30B 29/02* (2013.01); *Y10T 428/12472* (2015.01)

(58) Field of Classification Search
None
See application file for complete search history.

(56) References Cited

U.S. PATENT DOCUMENTS

| 5,709,957 A | 1/1998 | Chiang et al. |
| 6,248,401 B1 | 6/2001 | Chiang et al. |
| 2004/0079959 A1 | 4/2004 | Udagawa |
| 2009/0147401 A1 | 6/2009 | Takahashi et al. |
| 2009/0165903 A1 | 7/2009 | Miura |
| 2012/0070738 A1 | 3/2012 | Yoshida |

FOREIGN PATENT DOCUMENTS

| JP | H0841625 A | 2/1996 |
| KR | 20120030970 A | 3/2012 |

OTHER PUBLICATIONS

Koike et al., Nanofabrication of Multilayer Zone Plates bt Helicon Plasma Sputtering, Jpn. Appl. Phys. vol. 34 (1995) pp. 6754-6757 . (Year: 1995).*
PCT/US2013/060164 International Search Report and Written Opinion dated Dec. 20, 2013 (11 p.).

* cited by examiner

*Primary Examiner* — Adam Krupicka
(74) *Attorney, Agent, or Firm* — Conley Rose, P.C.

(57) ABSTRACT

Materials, including metals such as bulk metals, specialty alloys, metallic films and coatings, are made up of many tiny single crystals, which may also be referred to as grains. The boundaries between crystals are called grain boundaries and govern properties such as mechanical strength, deformation, and electrical resistivity. These properties are affected by not only the number of grain boundaries formed, but also the density and orientation of those grain boundaries. Twin boundaries are a special type of grain boundary which have symmetrical "mirror image" structures and preserve favorable qualities of grain boundaries while suppressing unfavorable properties such as the initiation of cracks, inclusions, and other unwanted flaws. Some metals and alloys form twins more easily than others during processing. Metals with low stacking fault energy (SFE) such as austenitic stainless steel, copper (Cu), and silver (Ag) form twin boundaries more easily than metals with high SFE such as Magnesium (Mg) and Aluminum (Al).

16 Claims, 13 Drawing Sheets

METHOD FOR PRODUCING HIGH STACKING FAULT ENERGY (SFE) METAL FILMS, FOILS, AND COATINGS WITH HIGH-DENSITY NANOSCALE TWIN BOUNDARIES

CROSS-REFERENCE TO RELATED APPLICATIONS

This application is a 35 U.S.C. § 371 national stage application of PCT/US2013/060164 filed Sep. 17, 2013 and entitled "Method for Producing High Stacking Fault Energy (SFE) Metal Films, Foils, and Coatings with High-Density Nanoscale Twin Boundaries," which claims benefit of U.S. Provisional Patent Application No. 61/702,115, filed Sep. 17, 2012, "Method for Producting High Stacking Fault Energy (SFE) Metal Films and Coatings with High-Density Nanoscale Boundaries," each of which is hereby incorporated herein by reference in its entirety.

STATEMENT REGARDING FEDERALLY SPONSORED RESEARCH OR DEVELOPMENT

This invention was made with government support under 0644835 and 0846504 awarded by the National Science Foundation (NSF). The government has certain rights in the invention.

BACKGROUND

Metallic materials, metal alloys, and metallic materials, including pure metals, bulk metals, specialty alloys, metallic films and coatings, are formed of a plurality of single crystals, which are often referred to as "grains." The interfaces or boundaries between individual crystals are referred to as "grain boundaries," and govern material properties such as mechanical strength, deformation, ductility, and electrical resistivity. These properties are affected by the number of grain boundaries formed, as well as the density and orientation of the grain boundaries. A particular type of boundary referred to as a "twin boundary" or "twin" is a grain boundary that has symmetrical "mirror image" structures. Twin boundaries advantageously preserve favorable qualities of grain boundaries and suppress unfavorable properties such as the initiation of cracks, inclusions, and other unwanted flaws. Twin boundaries are usually more stable than conventional grain boundaries when the material is heated, and usually maintain a relatively high strength at higher temperatures experienced during heating.

BRIEF SUMMARY OF THE DISCLOSURE

In an embodiment, a high stacking fault energy metal coating comprising: a first metal layer disposed on a first seed layer; wherein the first seed layer comprises a first plurality of defects; and wherein the first seed layer and the first metal layer have less than about 3% difference in interplanar spacing along at least a portion of a plurality of planes. The embodiment further comprising: wherein the first metal layer has a higher stacking fault energy than the first seed layer; wherein a second plurality of defects grow vertically through the first metal layer as a plurality of incoherent twin boundaries; wherein the second plurality of high density nanoscale twin boundaries grown through the first metal layer mirrors the first plurality of high density nanoscale twin boundaries; and wherein the metal coating has a hardness from about 1 GPa to about 20 GPa.

In an alternate embodiment, a multi-layered high stacking fault energy metal coating comprising: a plurality of seed layers; and a plurality of metal layers; wherein a first metal layer of the plurality of metal layers is disposed on a first seed layer of the plurality of seed layers, wherein the first seed layer comprises a first plurality of defects; and wherein at least a second seed layer is disposed on the first metal layer. The embodiment further comprising: wherein at least a second metal layer is disposed on the second seed layer; wherein the each seed layer of the plurality of seed layers has an interplanar spacing difference along at least a portion of planes of about less than 3% as compared to each metal layer of the plurality of the metal layers; wherein each metal layer of the plurality of metal layers has a higher stacking fault energy than the each seed layer of the plurality of seed layers; wherein the first plurality of defects comprises at least one of a plurality of coherent twin boundaries and a plurality of incoherent twin boundaries; and wherein at least some of the incoherent twin boundaries and at least some of the coherent twin boundaries combine to form a plurality of meandering boundaries at the interface of each seed layer and each metal layer.

In an alternate embodiment, a high stacking fault energy metal coating comprising: a substrate; a plurality of seed layers, wherein a first seed layer of the plurality of seed layers comprises a first material and wherein a second seed layer the plurality of seed layers comprises a second material. The embodiment further comprising: wherein the first seed layer is deposited on the substrate, wherein the second seed layer is deposited on the first seed layer; at least a first metal layer of the plurality of metal layers is deposited on the plurality of seed layers; a first plurality of defects grown at least one of vertically and laterally into the metal layer, mirroring the first plurality of twin boundaries in the seed layer, and wherein the metal coating has a hardness from about 1 GPa to about 20 GPa.

Embodiments described herein comprise a combination of features and advantages intended to address various shortcomings associated with certain prior devices, systems, and methods. The foregoing has outlined rather broadly the features and technical advantages of the invention in order that the detailed description of the invention that follows may be better understood. The various characteristics described above, as well as other features, will be readily apparent to those skilled in the art upon reading the following detailed description, and by referring to the accompanying drawings. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a detailed description of the preferred embodiments of the invention, reference will now be made to the accompanying drawings in which:

FIGS. 7(a) and 7(a') are an illustration of and an HRTEM figure of twin boundaries formed according to the method in the embodiment in FIG. 1.

FIGS. 7(b) and 7(b') are an illustration of and an HRTEM figure of twin boundaries formed according to the method in the embodiment in FIG. 2.

FIGS. 7(c) and 7(c') are an illustration of and an HRTEM figure of twin boundaries formed according to the method in the embodiment in FIG. 1 or the embodiment in FIG. 2.

DETAILED DESCRIPTION OF DISCLOSED EMBODIMENTS

Figure 1:
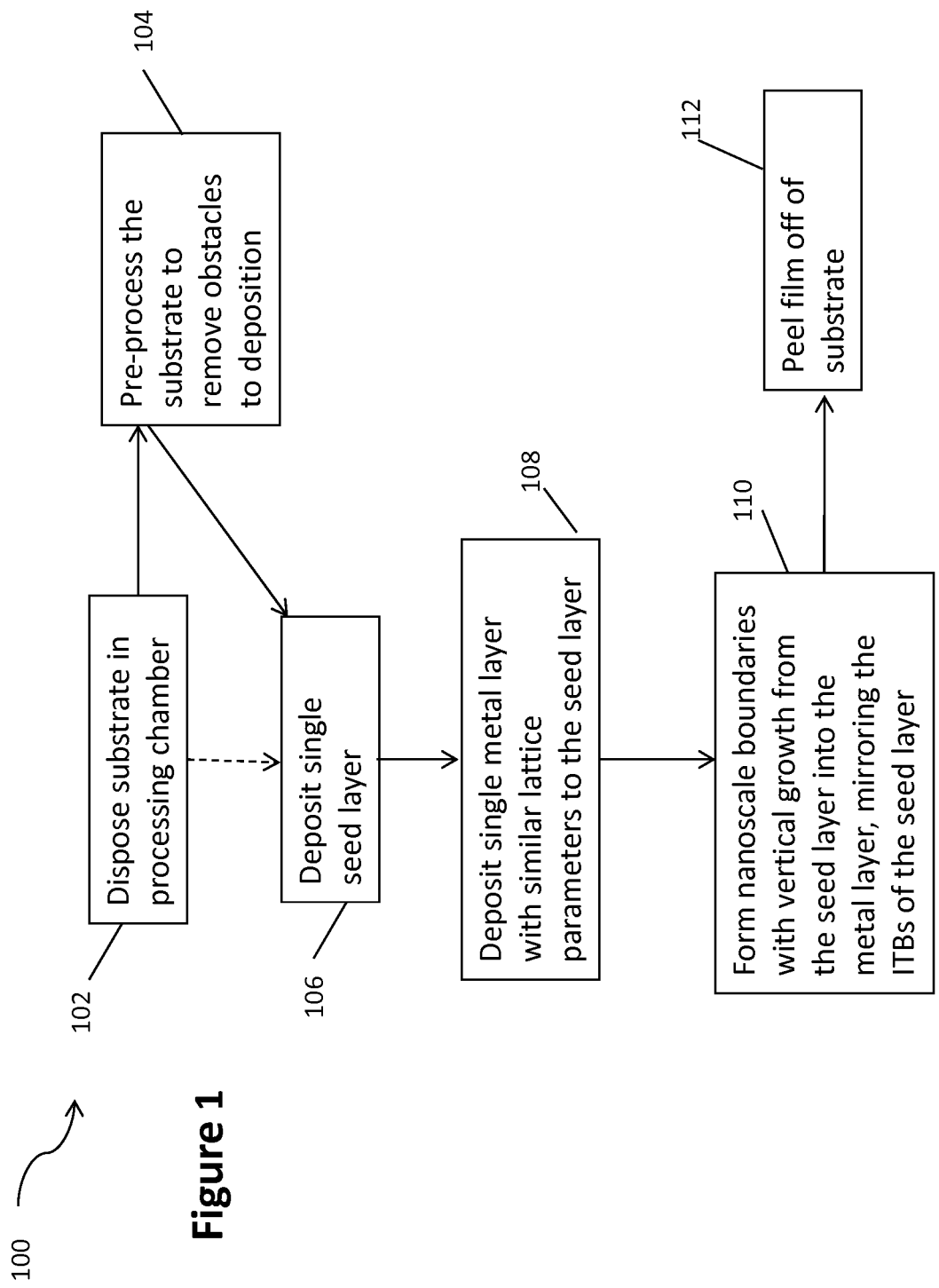
FIG. 1 is a flowchart illustrating an embodiment of a method for growing high density nanotwin boundaries in a high stacking fault energy (SFE) material.

The following discussion is directed to various exemplary embodiments. However, one skilled in the art will understand that the examples disclosed herein have broad application, and that the discussion of any embodiment is meant only to be exemplary of that embodiment, and not intended to suggest that the scope of the disclosure, including the claims, is limited to that embodiment.

Certain terms are used throughout the following description and claims to refer to particular features or components. As one skilled in the art will appreciate, different persons may refer to the same feature or component by different names. This document does not intend to distinguish between components or features that differ in name but not function. The drawing figures are not necessarily to scale. Certain features and components herein may be shown exaggerated in scale or in somewhat schematic form and some details of conventional elements may not be shown in interest of clarity and conciseness.

In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices, components, and connections. Also, as used herein the term "metal" refers to any material comprising or consisting of a pure metal, a metal alloy, a metallic material including films, foils, and coatings, or combinations thereof.

The present invention relates generally to methods for producing and growing nanotwinned boundaries in metal coatings, foils, and films. More particularly, the invention relates to the growth of nanotwinned boundaries in high stacking fault energy (SFE) metals. Still more particularly, the invention relates to the growth of nanotwinned boundaries in Aluminum. Embodiments of methods for growing and producing metals including nanotwinnned boundaries that enable preferred material properties are disclosed herein. Such embodiments are particularly useful in producing high SFE metals (e.g., Al) that have nanotwinned boundaries.

Crystal structures of metals, metal alloys, and metallic materials, can contain interruptions of one or two layers in the crystal structure's stacking sequence that give rise to stacking fault energy (SFE). In general, metals, metal alloys, and metallic materials can be characterized as low SFE materials (e.g., Silver (Ag), Silicon (Si), stainless steel, etc.), mid-range SFE materials (e.g., Copper (Cu), etc.) or high SFE materials (e.g., Magnesium (Mg), Nickel (Ni), Platinum (Pt), Aluminum (Al), etc.). In general, metals, metal alloys, and metallic materials with low stacking fault energy (SFE) form twin boundaries more easily during processing than metals, metal alloys, and metallic materials with high SFE.

Metals, metal alloys, and metallic materials can have crystalline structures of different types and geometries such as body-centered-cubic (bcc) and face-centered-cubic (fcc). Nanotwins in metals, metal alloys, and metallic materials having fcc crystalline structures often lead to near order-of-magnitude increases in mechanical strength while maintaining ductility and electrical conductivity that are comparable to the coarse-grained bulk metal of that material. A "nanotwin" refers to twin boundaries with separation distances of less than about 100 nm.

Accordingly, there remains a need in the art for formation of growth twins in aluminum. Formation of stable growth twins or stacking faults and controlled formation of these growth defects has never been accomplished in Al. A thermodynamic model predicts that the probability of twin formation during vapor deposition depends on the difference in critical radius of formation between a defect-free and twinned nucleus, which in turn depends on numerous parameters, most notably deposition flux and SFE. Increasing deposition rate effectively 'freezes' defects in place by piling up more material before atoms can diffuse to their ideal crystallographic sites, and hence introduces more growth defects, such as twins. However, for metals like Al, the SFE may be so high that increasing deposition rate alone has little influence on the nucleation of growth twins. The formation of high density growth twins in Al with assistance from Ag suggests that the Ag layers act as templates, whereby twins nucleate in Ag and then extend into Al through some means.

Three exemplary embodiments of the metal coating are discussed below. In the first embodiment, a single seed layer is deposited on a substrate by at least one of electroplating, physical vapor deposition, or chemical vapor deposition, wherein the physical deposition comprises at least one of sputtering, e-beam evaporation, molecular beam epitaxy, and cathodic arc discharging, and wherein the chemical vapor deposition comprises atomic layer deposition. The seed layer may be a low stacking fault energy (SFE) material such as copper (Cu), gold (Au), silver (Ag) in pure form, alloy form, or combinations thereof. The seed layer comprises a plurality of defects which may comprise at least one of high density nanoscale twin boundaries and a plurality of stacking faults. In general, a stacking fault refers to the addition or loss of an atomic plane as compared to a perfect crystal lattice, that is, a missing atomic plane or an extra atomic plane. A twin boundary is a boundary or plane defect where atoms are symmetrically distributed on each side of the boundary. At a minimum, a twin boundary, nano-scale or otherwise, comprises two layers of stacking faults. As such, a twin boundary may also be described as a defect comprising a plurality of layers of stacking faults, and the thinnest twin boundary may consist of a minimum of two atomic layers of stacking faults.

On top of the seed layer, a metal layer is deposited by at least one of electroplating, physical vapor deposition, or chemical vapor deposition, wherein the physical deposition comprises at least one of sputtering, e-beam evaporation, molecular beam epitaxy, and cathodic arc discharging, and wherein the chemical vapor deposition comprises atomic layer deposition. The metal layer may comprise at least one high SFE material, for example, aluminum (Al), palladium (Pd), nickel (Ni), or platinum (Pt), in pure form, alloyed form, or combinations thereof. The metal layer thickness may be between about 5 nm-100 microns and the seed layer thickness may be between 1 nm-200 nm. In an embodiment, and wherein the thickness of the plurality of seed layers is within 5 nm of the metal layer thickness. This may also be described as depositing a metal layer on top of a seed layer, where the seed layer acts as the substrate for the metal layer and a separate substrate may not be used.

The thickness of the respective metal and seed layers may depend on the composition of the layer(s), the end application, and the substrate. In any of the above embodiments, the coating formed by the deposition of at least one seed layer and at least one metal layer may remain on the substrate for use in an application. However, the coating may also be removed mechanically, thermally, chemically, or combinations thereof to form a freestanding component. This freestanding component may be applied to additional substrates or may be used alone in an application and may, depending upon thickness, be referred to as a film or a foil. In general, "film" is used to describe a coating that is less than about two microns whereas a foil has a thickness of greater than ten microns, but the words may be used interchangeably depending upon the industry/application utilizing the freestanding component.

In an alternate embodiment, a plurality of seed layers and metal layers are disposed on a substrate. In this embodiment, a first seed layer is disposed on a substrate and then a first metal layer is disposed on top of the first seed layer, and this is repeated for a plurality of iterations. The plurality of seed layers have at least one of similar lattice parameters and interplanar spacing to the plurality of metal layers, similar lattice parameters and interplanar spacing is when there is less than about a 3% difference between the lattice parameters and/or interplanar spacing (or at least a portion of the interplanar spacing) between the seed layer(s) and the metal layer(s). In this embodiment, the plurality of seed layers may be the same material or different materials and the plurality of metal layers may be the same material or different materials. The seed layer may be a low stacking fault energy (SFE) material such as copper (Cu), gold (Au), silver (Ag) in pure form, alloy form, or combinations thereof. The metal layers may comprise at least one high SFE material, for example, aluminum (Al), palladium (Pd), nickel (Ni), or platinum (Pt), in pure form, alloyed form, or combinations thereof. In this embodiment, the plurality of metal layers have a higher stacking fault energy than the plurality of seed layers, and the high density nanoscale twin boundaries comprise a plurality of coherent twin boundaries and a plurality of incoherent twin boundaries, wherein at least some of the incoherent twin boundaries and at least some of the coherent twin boundaries combine to form meandering boundaries.

In a third embodiment, a plurality of seed layers comprising a plurality of defects are deposited, a first seed layer is deposited on a substrate and then at least a second seed layer is disposed on the first seed layer. After a plurality of seed layers are disposed, at least one metal layer is disposed on top of the seed layer. In this embodiment, a first plurality of defects grow at least one of vertically and laterally into the metal layer, mirroring the first plurality of twin boundaries in the seed layer, and wherein the metal coating comprises a hardness from about 1 GPa to about 20 GPa. In addition, the substrate is one of a semiconductor, a metal, a ceramic, a composite material, glass, or a flexible polymer. The plurality of seed layers comprises at least one low stacking fault energy metal, wherein the at least one low stacking fault energy metal comprises silver, copper, gold, as well as alloys and combinations thereof, and wherein the plurality of metal layers comprises at least one high stacking fault energy metal, wherein the at least one high stacking fault energy metal comprises aluminum, platinum, platinum, nickel, as well as alloys and combinations thereof. Each seed layer of the plurality of seed layers disposed prior to the metal layer may be of the same material or may be of different materials, or combinations thereof.

FIG. 1 is a flowchart illustrating an embodiment of a method for growing high density nanotwin boundaries in a high stacking fault energy (SFE) material. Referring now to FIG. 1, an embodiment of a method 100 for growing and producing high density nanotwin boundaries in a high stacking fault energy (SFE) metal is shown. Beginning at block 102, a substrate is disposed in a processing chamber and at block 104 the substrate is pre-processed or cleaned to remove any obstacles to deposition (e.g., remove any oxide layers) from the substrate. In this embodiment, the substrate comprises silicon and may, in some embodiments, be etched in block 104. The etching may comprise using concentrated hydrofluoric (HF) acid, aqueous dilutions containing HF, or HF solutions buffered with ammonium fluoride, for a period of time sufficient to remove the entire oxide layer, between about a few second and minute. However, in general, the substrate can comprise another material such as a semiconductor, a ceramic, a metal, a composite material, glass, or a polymer (e.g., flexible polymer). In some embodiment, other pre-processing techniques can be used in block 104 to remove the oxide layer, impurities, or other obstacle to deposition from the substrate In some embodiments, no pre-processing of the substrate occurs and the method proceeds from block 102 to block 106. Examples of other types of pre-processing techniques include, without limitation, reactive plasma or thermal techniques, or other cleaning techniques. The substrate is pre-processed in block 104 to remove any oxide layers so that the subsequent processing steps in method 100 are performed on a clean surface of the substrate.

Moving now to block 106, a single seed layer is deposited onto the cleaned substrate. The seed layer comprises a plurality of high density nanoscale twin boundaries, which may be incoherent twin boundaries (ITB) or coherent twin boundaries (CTBs). As used herein, the term "high density" refers to boundaries are preferably separated by a distance of 5 nm-200 nm. The seed layer preferably comprises a low SFE material with a stacking fault energy of less than 100 mJ/m$^2$ such as pure silver, pure copper, or pure gold, as well as alloys of silver, copper, and gold, and combinations thereof. At block 108 a metal layer is disposed on top of and parallel to the seed layer deposited at block 106. In some embodiments, the metal layer comprises materials with an SFE of greater than 100 mJ/m$^2$, for example, pure nickel, pure palladium, pure aluminum, pure platinum, nickel alloys, palladium alloys, aluminum alloys, platinum alloys, and combinations thereof. As used herein, a low SFE material is one with an SFE of below 100 mJ/m$^2$ and a high SFE material is one with an SFE of greater than 100 mJ/m$^2$. In some embodiments, a low SFE material may be a material with an SFE of below 80 mJ/m$^2$.

In general, the deposition of the seed layer and the metal layer in blocks 106, 108, respectively, can be done at least one of electroplating, physical vapor deposition, or chemical vapor deposition, wherein the physical deposition comprises at least one of sputtering, e-beam or thermal evaporation, molecular beam epitaxy, and cathodic arc discharging, and wherein the chemical vapor deposition comprises atomic layer deposition. The deposited metal layer preferably has a thickness between 5 nm and 200 nm, and the seed layer preferably has a thickness between 10 nm and 100 nm. In some embodiments, the thickness of the seed layer is within 5 nm of the thickness of the metal layer and/or the thickness of the seed layer is 10 nm to 100 nm and the thickness of the seed layer is 5 to 10% of the thickness of the metal layer.

The seed layer and the metal layer preferably have similar lattice parameters and/or interplanar spacing, and further, the metal layer preferably has a higher SFE than the seed layer. For example, in some embodiments, the lattice parameters and/or interplanar spacing of the material used for the seed layer and the material used for the metal layer are identical, whereas in other embodiments, the lattice parameters and/or interplanar spacing of the material used for the seed layer and the material used for the metal layer are within 3% of one another. In some embodiments, the seed layer and the metal layer may have lattice parameters and/or interplanar spacing that differ by more than 2-3%. In other embodiments, this may be described as the metal layer and the seed layer having less than 3% difference of the interplanar spacing along at least a portion of the planes.

This embodiment may be used with a single seed layer, wherein a single seed layer is deposited on a substrate, then an intermediate layer is deposited parallel to and on top of the seed layer, and then a single (high SFE) metal layer is deposited. This embodiment may also be used when multiple seed and metal layers are disposed as described below with respect to FIGS. 2 and 3 as discussed below.

In an alternate embodiment, intermediate layer can be provided between the seed layer and the metal layer. For example, the seed layer can be directly disposed on the substrate after the substrate has been pre-processed or cleaned, the intermediate seed layer can then be disposed on the seed layer, and the metal layer can then be disposed on top of the intermediate layer. This intermediate seed layer may comprise the same material as the first seed layer, or may comprise a different material. In such embodiments, instead of the nanotwin growth occurring from the seed layer to the metal layer, the growth occurs from the seed layer through the intermediate layer into the metal layer. Such an intermediate seed layer can comprise a ceramic, metallic, metal, metal alloy, or other material as known in the art with lattice parameters and/or interplanar spacing that can bridge the gap in lattice parameters and/or interplanar spacing between the seed layer and the metal layer. This means that the thermo-mechanical properties of the material are improved because of this bridging of the gap.

Figure 2:
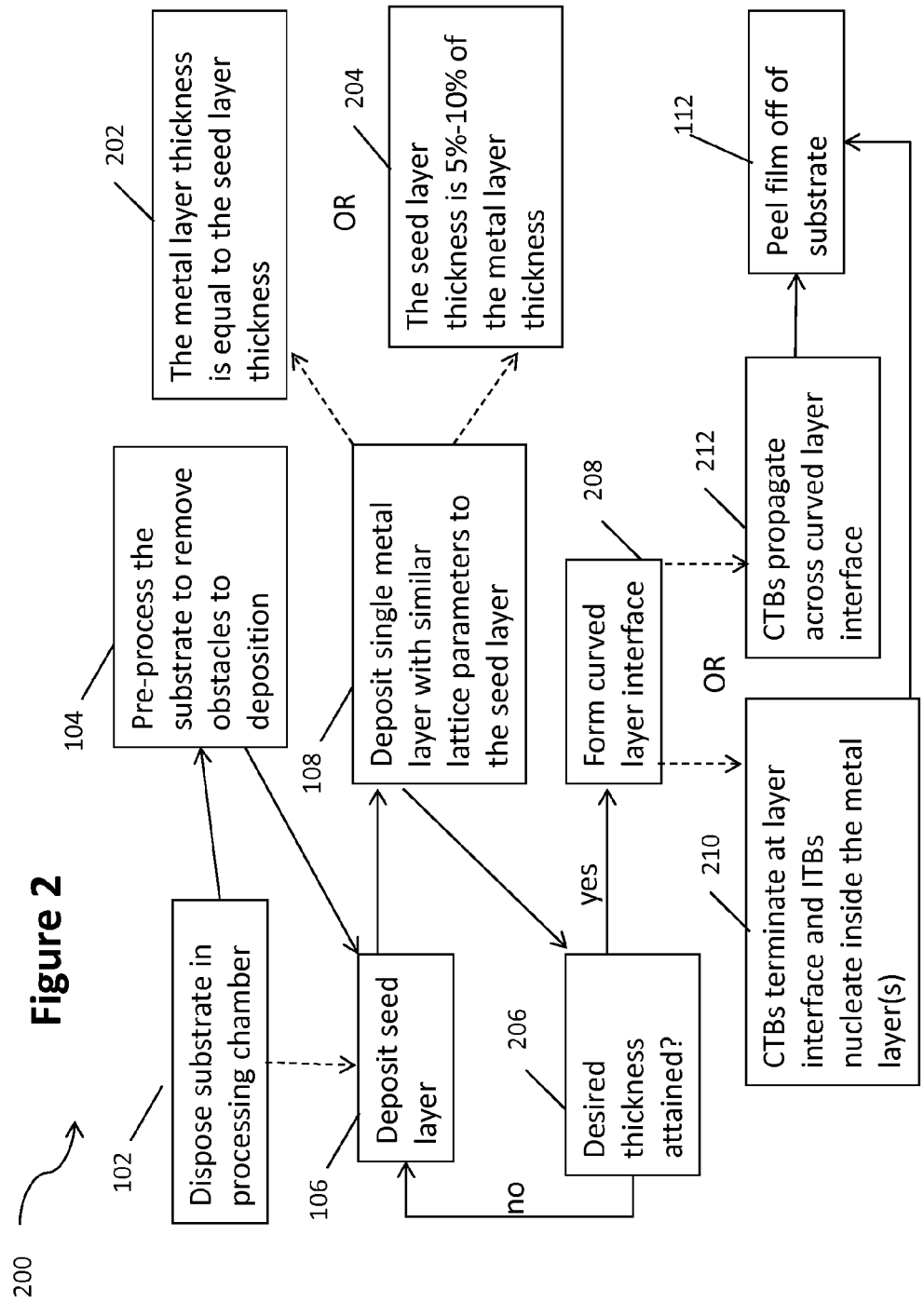
FIG. 2 is a flowchart illustrating another embodiment of a method for growing high density nanotwin boundaries in a high stacking fault energy (SFE) material.

FIG. 2 is a flowchart illustrating an embodiment of a method for growing high density nanotwin boundaries in a high stacking fault energy (SFE) material. Referring now to FIG. 2, an embodiment of a method 200 for growing and producing high density nanotwin boundaries in a high (SFE) material is shown. Method 200 includes blocks 102-108 as previously described with respect to method 100 and FIG. 1. However, in this embodiment, after a single metal layer is deposited at block 108, the method may either been performed as in block 202 where the metal layer thickness is equal to the seed layer thickness, or as in block 204, the seed layer thickness may be 5-10% of the metal layer thickness. In some embodiments, the method may proceed from block 102 to block 106 directly without any pre-processing.

In an embodiment at block 202, the thickness of the metal layer is equal to the thickness of the seed layer. In an embodiment at block 204, the seed layer thickness is 5%-10% of the metal layer thickness. At block 110, after deposition of the single metal layer at block 108, nanoscale boundaries are formed that may grow vertically from the seed layer into the metal layer. In an embodiment, this growth may mirror the ITBs present in the seed layer. In an embodiment, after the growth is observed, the deposited coating may be peeled off of the substrate in order to form a coating at block 12. If the desired thickness is obtained as determined at block 206, the method proceeds to blocks 208-112.

If the desired thickness is not obtained as determined at block 206, the method repeats blocks 106-108 under at least one of the thickness schemes at blocks 202 and 204 until the desired thickness is attained. In some embodiments, the metal layer thickness of each metal layer of the plurality of metal layers is from about 5 nm to 100 microns, and a seed layer thickness of each seed layer of the plurality of seed layers is from about 1 nm to about 200 nm.

In this embodiment, a multilayered coating is formed, and the layers deposited at block 106 may be the same composition or differing compositions, and the layers deposited at block 108 may also be the same composition of differing compositions, depending upon the embodiment. The desired thickness may be between 100 microns-100 nm. A curved interface may be formed and CTBs may either propagate across the curved layer interface into the metal layer or layers at block 212 or terminate at the layer interface and ITBs would nucleate instead inside the metal layer or layers. In an embodiment, after the growth of CTBs or ITBs inside the metal layer or layers is observed, the deposited coating may be peeled off of the substrate in order to form a film and/or foil at block 112.

Figure 3:
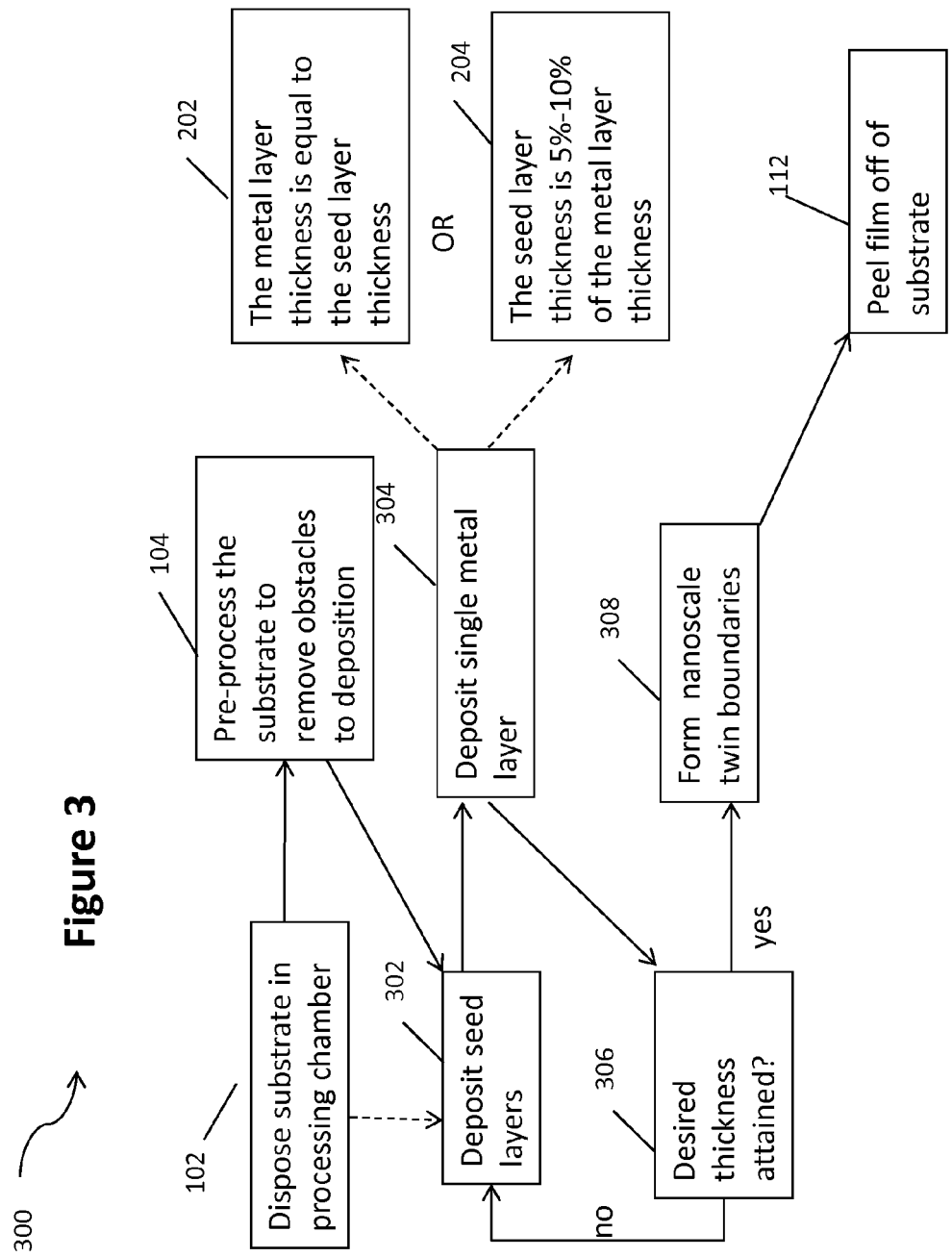
FIG. 3 is flowchart illustrating another embodiment of a method for growing high density nanotwin boundaries in a high stacking fault energy (SFE) material.

FIG. 3 is a flowchart illustrating an embodiment of a method for growing high density nanotwin boundaries in high stacking fault energy (SFE) material. Referring now to FIG. 3, an embodiment of a method 300 for growing and producing high density nanotwin boundaries in a high stacking fault energy (SFE) material is shown. Method 300 includes blocks 102, 104, 202, and 204 as previously described with respect to method 200 and FIG. 2. However, in method 300, a plurality of seed layers are disposed at block 302 prior to disposing the metal layer. In an embodiment, the method 300 may proceed directly from block 102 to block 302 without pre-processing. At block 302 at least two seed layers layer are deposited on top of the substrate, and at block 304 a single metal layer is deposited on top of and parallel to the seed layer. The metal layer thickness is from about 5 nm-100 microns, and each seed layer thickness is from about 1 nm-200 nm. In an embodiment, the total seed layer thickness is within 5 nm of the metal layer thickness. In an embodiment at block 202, the thickness of the metal layer is equal to the thickness of the seed layer. In an embodiment at block 204, the seed layer thickness is 5%-10% of the metal layer thickness. In either embodiment 202 or 204, if the desired thickness is obtained at block 306, the method proceeds. If the desired thickness is not obtained as determined at block 306, the deposition of the seed layer at block 302 and the deposition of the metal layer at block 304 are repeated until the desired thickness is obtained. In an embodiment, the desired thickness is 5 nm-100 nm. Nanoscale twin boundaries may be formed are block 308. These boundaries may be ITBs separated by less than 100 nm and the thickness of the boundaries may be 100 microns-100 nm. In an embodiment, the coating may be peeled off of the substrate to form a freestanding component at block 112, this freestanding component may be referred to as a film and/or a foil at block 112.

Experimental Results

Three mechanisms of growth for twin boundaries were observed in Aluminum (Al), a high SFE material. All of the coatings deposited during the experiment were deposited at room temperature using DC magnetron sputtering. Single crystal silicon substrates with (111) orientation were etched with hydrofluoric acid (HF) in order to remove the native oxide layer prior to deposition. The base pressure prior to the deposition was typically $5-9 \times 10^{-8}$ torr, and Ar gas (99.99%) pressure during sputtering was $\sim 3.6 \times 10^{-3}$ torr. Pure Al (99.99% or better) and Ag (99.99%) targets were used. Single Al layers were deposited directly on to the etched Si substrate to a thickness of 2 μm. A 100 nm seed layer of Ag was deposited first to ensure epitaxial growth in the Ag/Al multilayer films/coils/coatings. Stabilizing of twin boundaries in high SFE materials can be accomplished in two ways. The first method is reducing twin boundary energy or constraining the system such that the twinned state has the lowest possible energy. Alloying can also decrease the SFE, thereby enhancing energetic stability of twin boundaries and faults. However, an alternate mechanism to the two disclosed above may be to stabilize twin boundaries in high SFE materials, specifically in fcc metals, by using the epitaxial structure. Epitaxial growth of one layer on top of another, for example, the epitaxial growth of Ag on Si, resulted in the formation of one of either twin boundaries or matrix boundaries, and the growth of Al on that layer of Ag caused the Al layer to take the same structure as the Ag. The domains in Al were separated by incoherent (ITB) and coherent (CTB) twin boundaries, as opposed to more conventional high or low-angle grain boundaries.

The three growth mechanisms observed were seen in three different methods of deposition. The first method first deposited a single 100 nm Ag seed layer on an HF-etched silicon (111) substrate and then deposited a 1 μm layer of pure Al on top of the seed layer. This method is an effective method for growing nanotwins in metals with a low SFE. The second method deposited a first seed layer and then alternating individual layers of Ag and Al on top of the first 100 nm seed layer of Ag. The Ag and Al layers had equal h of 1-100 nm, where h was the layer thickness. The third method used a seed layer of 100 nm Ag with alternating layers with Al 100 nm and $h_{Ag}$ of 5 and 10 nm were deposited on top of the seed layer. In all three methods, the overall thickness attained was 1.1-1.5 μm.

Figure 4B:
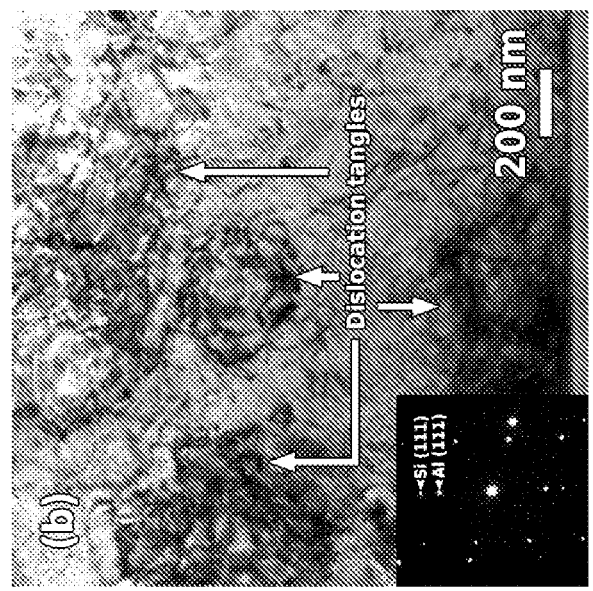
FIG. 4(b) is a transmission electronic microscopy image illustrating a nanotwinned Al growth mechanism with no seed layer.
Figure 4A:
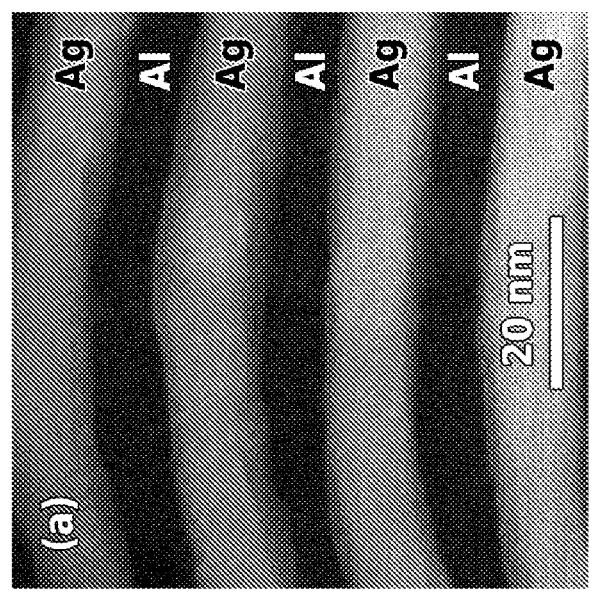
FIG. 4(a) is a HAADF-STEM micrograph illustration of a nanotwinned growth mechanism using equal h alternating layers of Ag and Al deposited according to the method in FIG. 2.

FIG. 4(a) is a HAADF-STEM micrograph illustration of a nanotwinned growth mechanism using equal h alternating layers of Ag and Al deposited according to the method in FIG. 2. More specifically, FIG. 4(a) is a HAADF-STEM micrograph of the second method with equal h layers of Ag and Al, where h is the layer thickness and where the layers measure about 10 nm each in thickness. FIG. 4(a) revealed minimal intermixing even at 10 nm. The larger the h of the layer, the less the contribution of the intermixing to the formation of twin boundaries.

FIG. 4(b) is a transmission electronic microscopy image illustrating a nanotwinned Al growth mechanism with no seed layer. FIG. 4(b) depicts the resultant growth when Al was deposited directly on to the silicon substrate with no seed layer. FIG. 4(b) revealed an epitaxial structure with dense dislocation tangles, which may indicate that essentially the entire single layer Al coating comprised a single crystal-like epitaxial variant where no twins formed. A few stacking faults were observed on various {111} planes, which disappeared after a few seconds of electron beam annealing. The coating-substrate interface exhibited a scarcity of small twin variants extending just a few nm into the coating, these variants were exceedingly rare and nucleated only at the film-substrate interference.

Figure 5C:
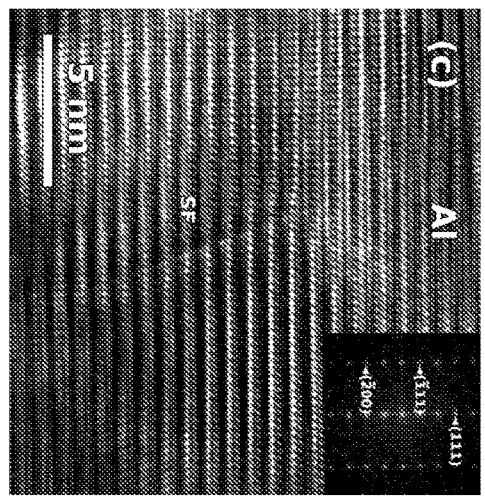
FIG. 5(c) depicts a high resolution TEM (HRTEM) micrograph in of a wide ITB formed by the method in FIG. 2.
Figure 5A:
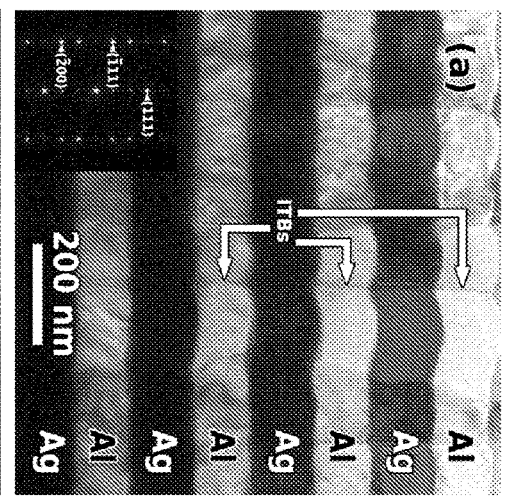
FIG. 5(a) is a HAADF-STEM micrograph illustration of a coating deposited using the method of FIG. 2.

FIG. 5(a) is a HAADF-STEM micrograph illustration of a coating deposited using the method of FIG. 2. In contrast to FIG. 4(b), a TEM examination of epitaxial Ag/Al multilayer coatings with various h revealed high-density twins and stacking faults within the Ag layers. Ag had the lowest stacking fault and twin boundary energies among the monolithic fcc metals and these features commonly appear in Ag films. FIG. 5(a) depicts a multilayer epitaxial Ag 100 nm/Al 100 nm coating comprising layers of Ag and Al of about the same thickness, in this example, 100 nm. The layers appeared wavy due to island growth mechanisms and residual growth stress. Many ITBs stretched nearly vertically across several Ag and Al layers. The inset selected area diffraction pattern taken from a large area confirmed the formation of an epitaxial multilayer coating with high density CTBs and abundant ITBs. Given a [111] growth direction, the matrix and twin variants are related by a 180° rotation about this axis, so that the (111) plane may be the twinning plane.

Figure 5D:
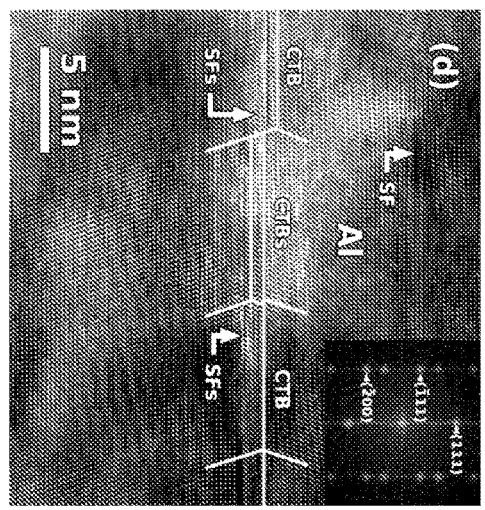
FIG. 5(d) depicts that CTBs formed by the method in FIG. 2 are comprised of atomic steps.
Figure 5B:
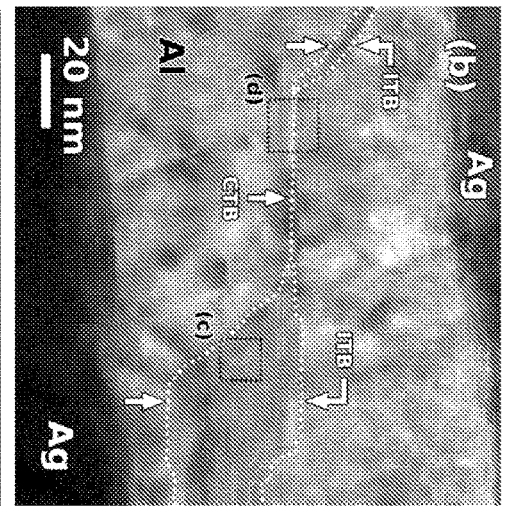
FIG. 5(b) transmission electronic microscopy image illustrating a coating deposited using the method of FIG. 2

FIG. 5(b) transmission electronic microscopy image illustrating a coating deposited using the method of FIG. 2. FIG. 5(b) is an embodiment of the method where groups of ITBs in Al connected CTBs with lengths of over tens of nanometers (i.e. at least 10 nanometers or multiples of 10 nanometers). For example, some ITBs also had widths of over 100 nm. FIG. 5(c) depicts a high resolution TEM (HRTEM) micrograph in of a wide ITB formed by the method in FIG. 2. FIG. 5(c) depicts a high resolution TEM (HRTEM) micrograph in of a wide ITB which was confirmed by the inset fast Fourier transform (FFT). The structure in FIG. 5(c) can also be considered as a 9R phase, similar to those observed previously in low SFE metals, such as Cu, Ag, and Au. The ITBs in epitaxial nanotwinned Cu and Ag typically align vertically (parallel to the growth direction). However, a significant portion of ITBs in the Al appeared curved. This curved appearance may stem from a twin boundary structure in which CTB and ITB units combine to form meandering boundaries, a structure previously observed in Au and termed the chain unit model. In addition, many longer CTB segments were not confined to a single {111} plane.

FIG. 5(d) depicts that CTBs formed by the method in FIG. 2 are comprised of atomic steps. FIG. 5(d) depicts that CTBs were comprised of atomic steps due to numerous stacking faults located adjacent to the CTBs. Similar high-density growth twins also formed in Al in other Ag/Al multilayer coatings with equal h varying from 1 to 50 nm. The aforementioned observations illustrated that 100 nm thick Ag layers sufficed to induce abundant twins in Al.

Figure 6C:
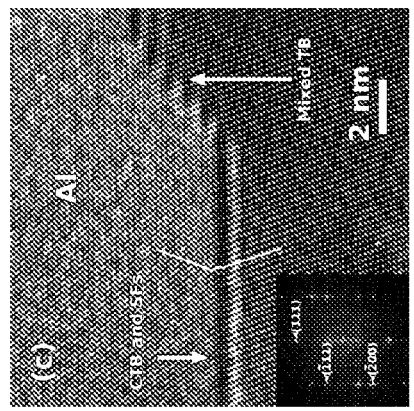
FIG. 6(c) is an HRTEM micrograph which presents an atomic-resolution view of a CTB joined to a mixed boundary in a coating made according to the embodiment in FIG. 2.

Experiments using thinner Ag layers were also performed to determine if a thinner seed layer might produce a similar microstructure. Coatings comprising multiple layers of Ag 5 nm/Al 100 nm were also examined. FIG. 6(a) is a bright-field cross-sectional TEM micrograph of a 5 mm Ag layer that induced twins in the Al layers according to the method in FIG. 2. As shown in FIG. 6(a), thinner Ag layer still induced twins in the Al layers, with structures similar to those observed in coating with repeating layers of Ag 100 nm/Al 100 nm. Again, many ITBs extended through multiple Ag and Al layers. The inset SAD pattern confirms the formation of high-density twins, and shows no components other than the matrix and twins.

Figure 6B:
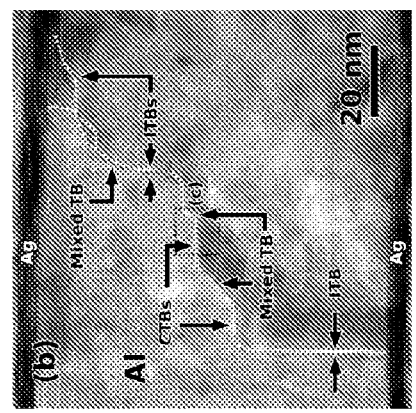
FIG. 6(b) is a bright-field cross-sectional TEM micrograph depicting a meandering twin boundary for a coating made according to the embodiment in FIG. 2.
Figure 6A:
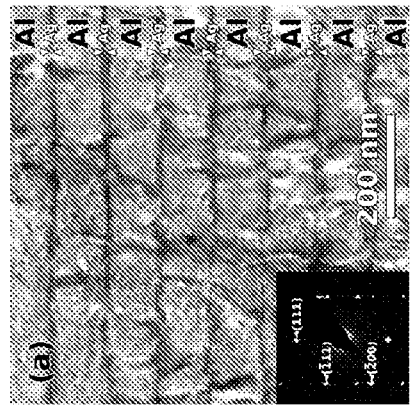
FIG. 6(a) is a bright-field cross-sectional TEM micrograph of a 5 mm Ag layer that induced twins in the Al layers according to the method in FIG. 2.

FIG. 6(b) is a bright-field cross-sectional TEM micrograph depicting a meandering twin boundary for a coating made according to the embodiment in FIG. 2. FIG. 6(b) shows a typical ITB nucleated from the Ag/Al interface and propagating into the Al layer. The ITB extended through the Al layer by intermingled CTB and ITB segments, and eventually terminated at the upper Ag/Al interface.

FIG. 6(c) is an HRTEM micrograph which presents an atomic-resolution view of a CTB joined to a mixed boundary in a coating made according to the embodiment in FIG. 2. FIG. 6(c) shows the HRTEM micrograph which presents an atomic-resolution view of a CTB decorated by an adjacent stacking fault (SF), and a mixed inclined TB consisted of zigzag steps of CTBs and ITBs.

Figure 6D:
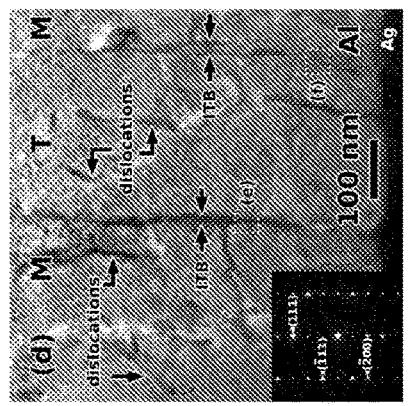
FIGS. 6(d)-6(f) show how far twin boundaries might grow into the Al layer when epitaxial Al 1000 nm is deposited on Ag seed in coatings made according to the embodiment in FIG. 1.
Figure 6E:
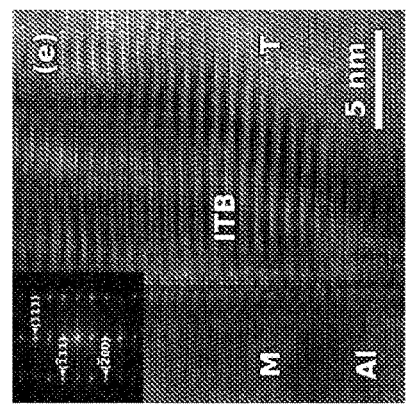
Figure 6F:
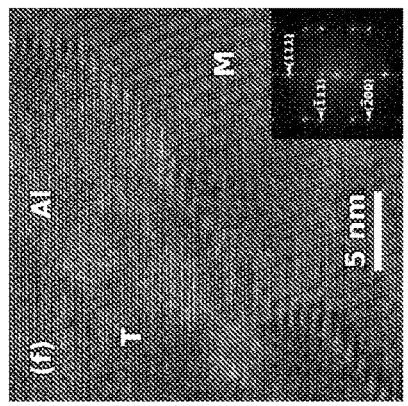

FIGS. 6(d)-6(f) show how far twin boundaries might grow into the Al layer when epitaxial Al 1000 nm is deposited on Ag seed in coatings made according to the embodiment in FIG. 1. FIGS. 6(d)-6(f) show how far twin boundaries might grow into Al when epitaxial Al 1000 nm is deposited on Ag seed. While high-density twins were still present, the structure of these Al coatings differed substantially from the aforementioned multilayer coatings. FIG. 6(d) showed adjacent twin variants extended hundreds of nanometers into Al along the growth direction, resulting in a columnar structure with long ITBs separating adjacent domains. The inset SAD pattern (taken from Al alone) shows the formation of epitaxial Al with CTBs and ITBs. FIG. 7(e) is an HRTEM micrograph and FFT that shows ITBs of various widths were predominant in these coatings, although some mixed ITB/CTB segments were still present, as shown by HRTEM micrograph in FIG. 7(f).

Figure 7A:
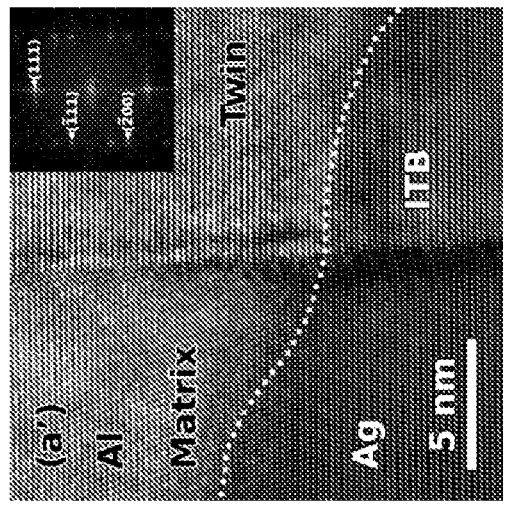
Figure 7A:
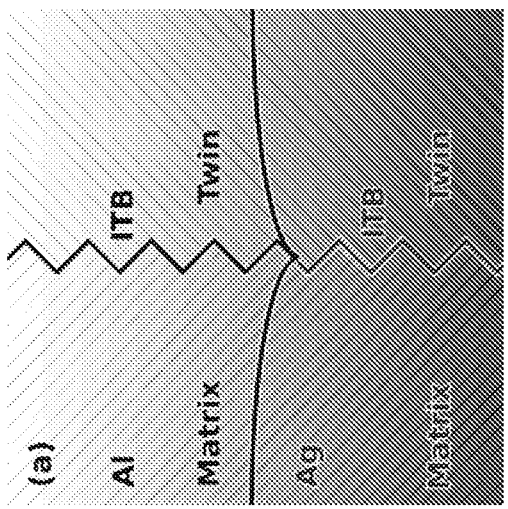

FIGS. 7(a) and 7(a') are an illustration of and an HRTEM figure of twin boundaries formed according to the method in the embodiment in FIG. 1. FIGS. 7(b) and 7(b') are an illustration of and an HRTEM figure of twin boundaries formed according to the method in the embodiment in FIG. 2. FIGS. 7(c) and 7(c') are an illustration of and an HRTEM figure of twin boundaries formed according to the method in the embodiment in FIGS. 1 and/or 2. FIGS. 7(a')-7(c') are TEM photographs corresponding to each of the three mechanisms. In mechanism (1) where a single metal layer was deposited on a single seed layer, as shown schematically in FIG. 7(a), domains in the epitaxial Ag layers take only two possible orientations, twin or matrix, between which ITBs form. Al can grow epitaxially on Ag, and thus the orientations of Ag domains as well as ITBs are replicated, and ITBs extend into Al as observed in HRTEM micrograph in FIG. 7(a').

Figure 7B:
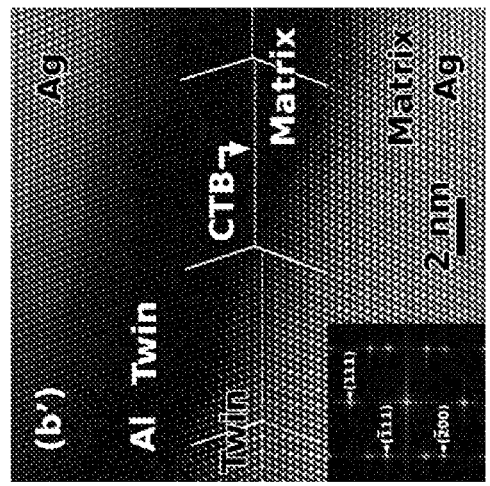
Figure 7B:
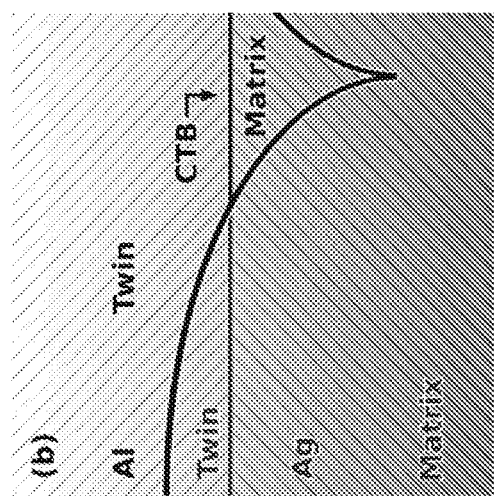

In mechanism (2) where there is a multi-layer structure with a first seed layer and then alternating layers of seed layers and base layers, illustrated in FIG. 7(b), CTBs extended laterally from Ag into Al. Should CTBs terminate at the layer interface, ITBs may then nucleate inside Al to join the variants, consequently increasing the total energy of the system. Hence, propagation of CTBs across a curved layer interface into Al may be energetically favorable. The HAADF-STEM micrograph in FIG. 7(b') provides an example of this mechanism (note that the Al layer is dark in the STEM mode).

Figure 7C:
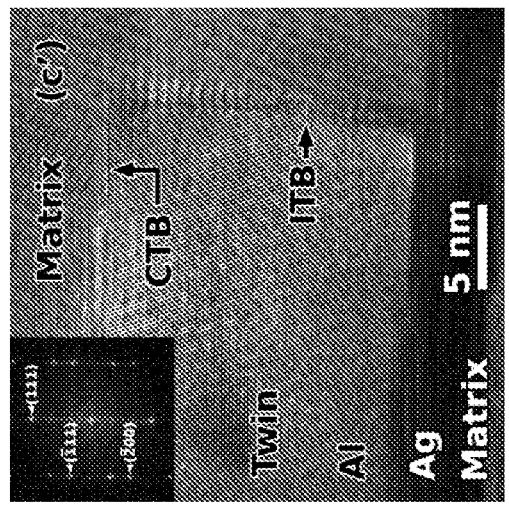
Figure 7C:
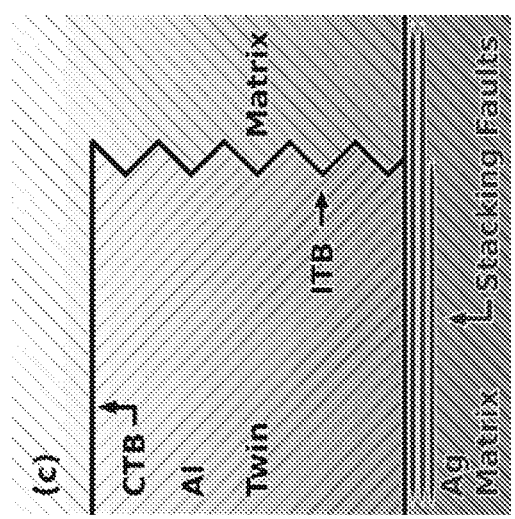

In FIG. 7(c), mechanism (3), where a plurality of seed layers were deposited prior to the deposition of a first metal layer, twin variants are formed in Al even if the underlying Ag consists of a single variant, as shown in FIG. 7(c'). In this example, the coating was manufactured by the method in the embodiment of FIG. 2. The HRTEM micrograph in FIG. 7(c') reveals a narrow ITB nucleated from stacking faults at the Ag/Al interface, which grew straight into Al. After propagating by ~20 nm it deviated leftwards, and a CTB thus formed. Some very wide ITBs in Al nucleated in this manner as well. In this mechanism, jumbles of stacking faults in Ag result in similar jumbles in Al near the interface, and ITBs may nucleate from the dense stacking faults. This mechanism may be unique as only a few atomic layers of stacking faults can initiate the nucleation of ITBs in Al. Coherency may be present here as it allows Al to replicate the microstructure of stacking faults in Ag and eventually trigger the nucleation of ITBs that propagate vertically into Al. In each mechanism, epitaxial growth ensures that only two variants (matrix and twin) form within the Ag layers.

The Ag and Al system is ideal for the propagation of defects from layer to layer. The lattice mismatch of less than 1% ensures that the Al/Ag boundary is a nearly perfect El boundary; parallel crystallographic indices are parallel in both the under- and over-layers, and there may not be a need for misfit dislocations, domain matching, or a change in crystallographic orientation to make a lattice match. Hence, the Al over-layer replicates the Ag under-layer almost exactly, including both the twin variant orientation and twin boundaries. This relationship is clearly highlighted in HRTEM micrographs in FIGS. 4(a') and 4(b'), where the atomic planes are continuous across the layer interface, and the inset SAD patterns indicate a bicrystal structure (due to twins) without any tilt, rotation, or mis-orientation between the layers.

Figure 8:
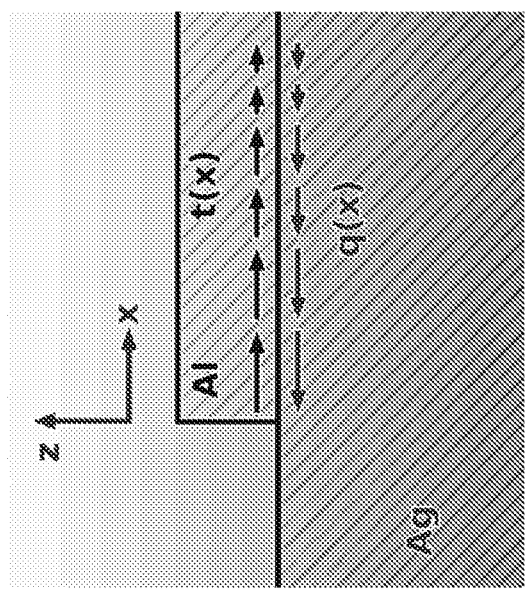
FIG. 8 is a graphical illustration of the shear stress developed at the edge of an Al island grown on Ag during deposition according to the method of FIG. 2.

FIG. 8 is a graphical illustration of the shear stress developed at the edge of an Al island grown on Ag during deposition according to the method of FIG. 2. Stress transfer occurs via shear stress between Ag and Al near the free edge. Turning back to mechanism 3, during island growth, an interface fraction may arise between the island and the substrate. This traction is a shear stress whose magnitude depends on the distance from the edge of the island. We consider the growth of an island with z parallel to the growth direction and x perpendicular (FIG. 8), so the shear stress, τ(x), can be expressed as $$\tau(x) \sim \sigma_m \sqrt{\frac{kh_f}{2\pi x}}, \quad (1)$$

asymptotically as $x/h_f \to 0^+$. Here $\sigma_m$ is biaxial mismatch stress (defined as $\sigma_m = \varepsilon_{max} E_f/(1-v_f)$) between the coating and substrate, $\varepsilon_{max}$ is the mismatch strain between Ag and Al, $h_f$ is coating thickness, and x=0 at the free edge of the island. Also, k is the plane strain elastic modulus ratio between substrate and coating, computed by $$k = \frac{\frac{E_s}{1-v_s^2}}{\frac{E_f}{1-v_f^2}}, \quad (2)$$

where $E_s$, $v_s$, $E_f$, and $v_f$ are elastic modulus and Poisson's ratios of the substrate and coating, respectively. The magnitude of τ(x) increases with proximity to the free edge, or with increasing coating thickness. If we consider an Al layer on a substrate of Ag, k is approximately 1.21. Mismatch stress is approximately 1.1 GPa, as mismatch strain $\varepsilon_{max}$ between Al and Ag is ~1%. Therefore, we estimate τ(x) of 470-1140 MPa when $h_f/x$ is 1-6, i.e., near the edge of the island.

Critical stress, $\tau_c$, for nucleating Shockley partial dislocations can be estimated by a relation derived for deformation twinning by classical dislocation theory, $$\tau_c = \frac{2\alpha \mu b_p}{D} + \frac{\gamma}{b_p}, \quad (3)$$

where α is a constant (0.5 for edge and 1.5 for screw dislocations), μ is the shear modulus (35 GPa for Al), γ is the SFE of Al (~120-165 mJ/m²), D is the grain size, and $b_p$ is the Burger's vector of a partial dislocation. For Al with D=15 nm, $\tau_c$ for an edge dislocation is estimated to be ~1.1-1.4 GPa, near the upper limit of stress provided by island growth. However, this analysis likely serves only as an upper-bound estimation. Another, more complete consideration shows through mesoscale dislocation mechanics and density functional theory calculations that the critical shear stress which may be present for twinning to occur in Al is only ~220 MPa, much less than that predicted by classical dislocation nucleation theory. Hence, fraction near the edge of an Al island provides sufficient stress to nucleate Shockley partial dislocations at the interface during deposition. We also note that mechanisms (1) and (3) only result in the formation of adjacent twin variants separated by ITBs. CTBs may form directly by mechanism (2), or serve as horizontal junctions between ITBs, as evidenced by the TEM micrograph in FIG. 7(c'). Usually a mixture of ITB and CTB segments comprises most boundaries, resulting in meandering TB paths throughout Al, as illustrated in FIGS. 2-3.

Turning back to the relative abundance of ITBs in comparison to CTBs in Al may be related to the total grain boundary energy within the system. The energy of ITBs in Al varies from 223-357 mJ/m², while the energy of its CTBs is ~75 mJ/m². In comparison, Cu has an ITB energy of ~550-714 mJ/m² and CTB energy of ~24-39 mJ/m², while Ag has corresponding energies of ~126 mJ/m² and ~8 mJ/m². The ratios of ITB/CTB energy in Al, Ag, and Cu are ~3.5, ~16, and ~22, respectively. ITBs are much closer in energy to CTBs in Al, which helps to explain the relative abundance of ITBs to the CTBs in Al, whereas in Ag and Cu CTBs are predominant. ITBs in Al can be described equivalently by dislocation theory or as a volume of 9R phase. Although there is the presence of ITBs (and hence at least a small volume of 9R phase), as seen in FIGS. 2b-c and 3d-e, the actual volume of 9R phase may not be clear. While some of these ITBs depicted in FIG. 5(b) appear to have a very large volume, there may be a possibility that this may be an artifact caused by a boundary with a component running parallel to the foil plane. When projected onto a 2-dimensional surface, such a boundary may appear much wider than it actually is. One can postulate that some distortion of the projected image might occur under such conditions, which may explain the distorted appearance of the ITB in FIG. 6e. However some sizable portions of other boundaries (FIG. 5c) do not appear to have such distortion, and may indeed be thicker slabs of 9R Al. Local stresses affect the width of ITBs, and may cause the dissociation of an ITB into a greater width, however the typical width of such a dissociation may be much smaller than the seemingly huge ITBs observed in this study. Future HRTEM analysis will reveal whether the ITBs observed in this study are the result of projecting typical ITBs onto a flat surface, or if the samples actually do contain large volumes of 9R phase.

Figure 9:
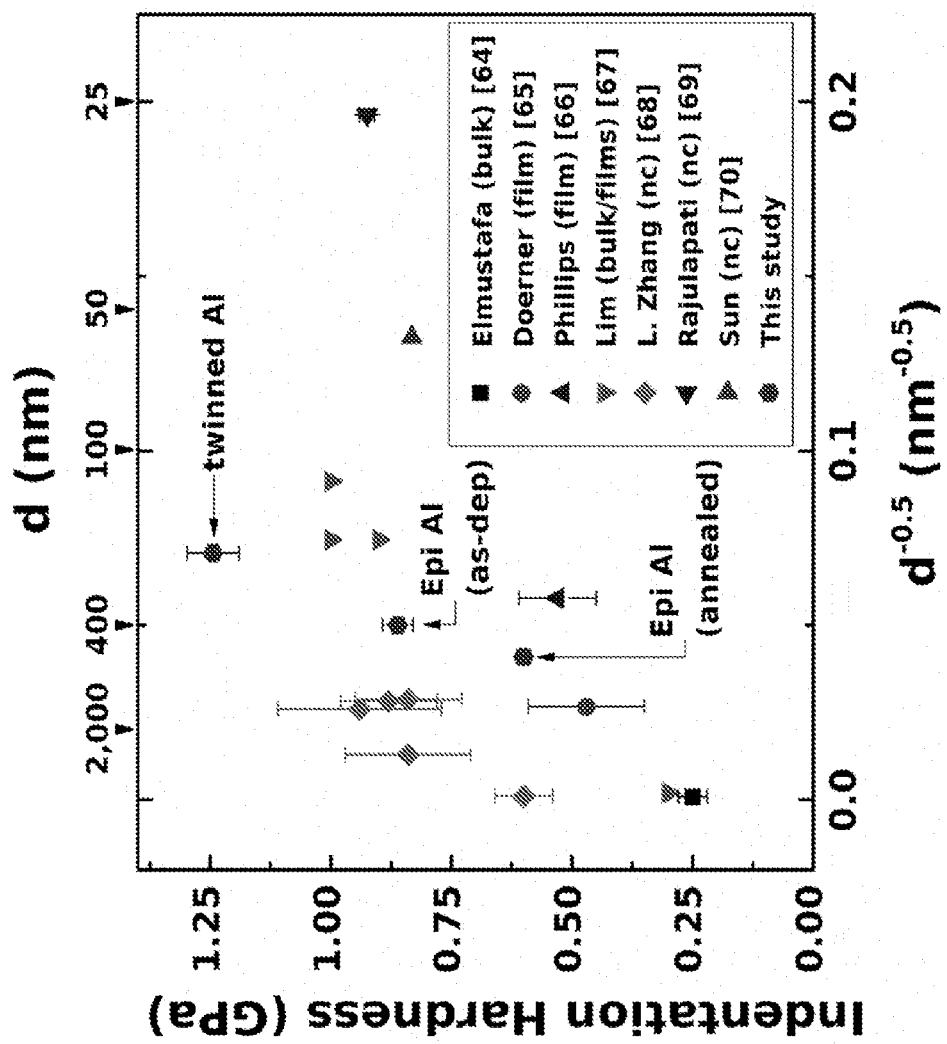
FIG. 9 is a graphical illustration of indentation hardness values for Al as a function of grain size.

FIG. 9 is a graphical illustration of indentation hardness values for Al as a function of grain size. FIG. 9 illustrates compiled indentation hardness data and includes only monolithic Al in the form of coatings and bulk specimens. Hardness of the as-deposited and annealed un-twinned single layer Al coatings falls in the expected range given by other studies (~0.6-0.8 GPa), whereas hardness of twinned epitaxial Al coatings (both multilayered coatings and those on a single seed layer) reaches ~1.2 GPa, approximately 50-100% harder than the untwined Al coatings, and harder than nanocrystalline Al with an average grain size of 20-50 nm prepared by consolidation of nanograined powders. The average spacing between ITBs in epitaxial nanotwinned Al coatings may be ~200 nm, greater than the columnar grain size of Al coatings in previous studies, but the hardness may also be greater. Increased strength in nanotwinned Al coatings reflect contributions from both ITBs and CTBs, resulting in an effective barrier spacing likely smaller than the ~200 nm columns defined by the ITBs. A recent mechanistic model formulated to rationalize feature size-dependent strengthening caused by both grain and twin boundaries shows that contributions from both types of boundaries are important, especially if they are of similar length scales. Furthermore a substantial volume fraction of 9R phase (broad ITBs) may also enhance the strength of nanotwinned Al coatings. The hardness of Ag 5 nm/Al 100 nm multilayer coatings may be nearly 2 GPa. Here ITBs, CTBs, and layer interfaces may all contribute to hardening.

Figure 10:
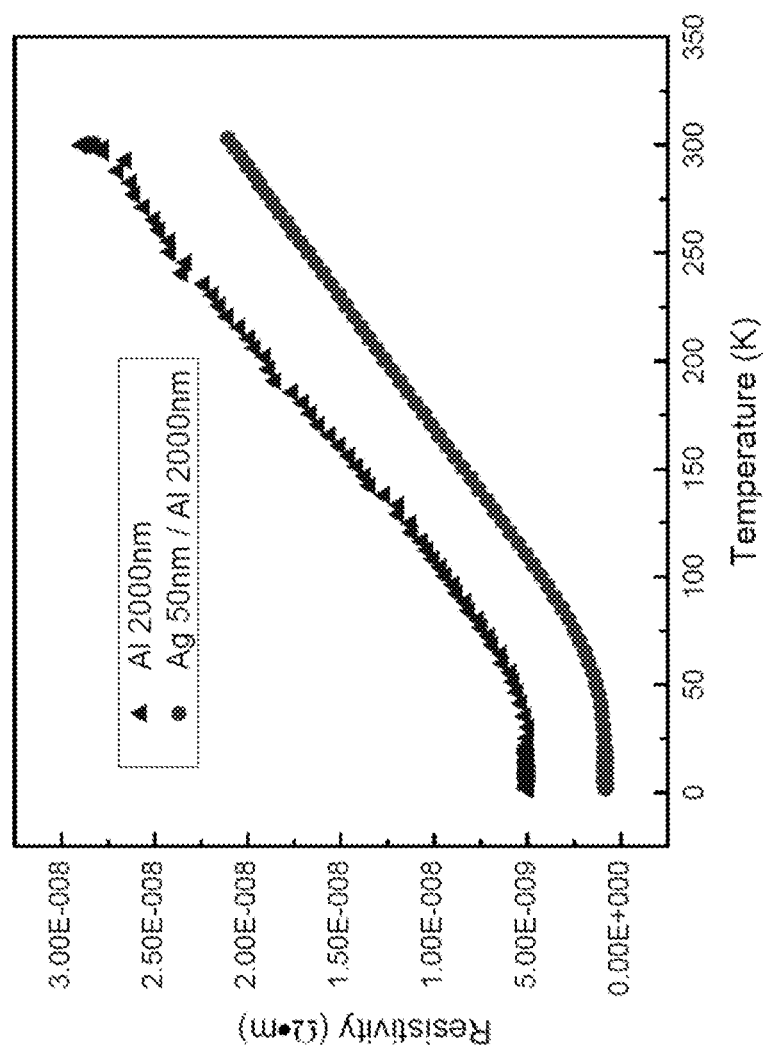
FIG. 10 illustrates the effect of temperature on resistivity of nanotwinned Al films.

FIG. 10 illustrates the effect of temperature on resistivity of nanotwinned Al films. The nanotwinned Al, for example, as described above has electrical resistivity comparable to Al films. There are two factors that contribute to these results. First, nanotwinned Al and as indicated by the triangular points in FIG. 10, may have less defects than epitaxial Al which may have a plurality of dislocation loops. Second, in nanotwinned Al, there is a 50 nm Ag seed layer as indicated by the circular points in FIG. 10 which may aid in reducing resistivity.

While preferred embodiments have been shown and described, modifications thereof can be made by one skilled in the art without departing from the scope or teachings herein. The embodiments described herein are exemplary only and are not limiting. Many variations and modifications of the systems, apparatus, and processes described herein are possible and are within the scope of the invention. For example, the relative dimensions of various parts, the materials from which the various parts are made, and other parameters can be varied. Accordingly, the scope of protection is not limited to the embodiments described herein, but is only limited by the claims that follow, the scope of which shall include all equivalents of the subject matter of the claims. Unless expressly stated otherwise, the steps in a method claim may be performed in any order. The recitation of identifiers such as (a), (b), (c) or (1), (2), (3) before steps in a method claim are not intended to and do not specify a particular order to the steps, but rather are used to simplify subsequent reference to such steps.

What is claimed is:

1. A high stacking fault energy metal coating comprising:
   a plurality of seed layers, wherein a first seed layer of the plurality of seed layers comprises a first material, wherein a second seed layer of the plurality of seed layers comprises a second material, wherein the first seed layer is deposited on a substrate, and wherein the second seed layer is deposited on the first seed layer;
   at least a first metal layer of a plurality of metal layers is deposited on the plurality of seed layers;
   a first plurality of defects grown at least one of vertically and laterally into the first metal layer, mirroring a first plurality of twin boundaries in the seed layer, and wherein the metal coating has a hardness from about 1 GPa to about 20 GPa;
   wherein the metal coating is peeled off of the substrate to be a free standing component.

2. The metal coating of claim 1, wherein the plurality of seed layers comprise at least one low stacking fault energy metal, wherein the at least one low stacking fault energy metal comprises silver, copper, gold, as well as alloys and combinations thereof, and wherein the plurality of metal layers comprises at least one high stacking fault energy metal, wherein the at least one high stacking fault energy metal comprises aluminum, platinum, platinum, nickel, as well as alloys and combinations thereof.

3. The metal coating of claim 1, wherein the metal layer thickness of each metal layer of the plurality of metal layers is from about 5 nm to about 100 microns, wherein a thickness of each seed layer is from about 1 nm to about 200 nm.

4. The metal coating of claim 1, wherein the substrate is one of a semiconductor, a metal, a ceramic, a composite material, glass, or a flexible polymer.

5. The metal coating of claim 1, wherein the plurality of seed layers are deposited by at least one of electroplating, physical vapor deposition, or chemical vapor deposition, wherein the physical deposition comprises at least one of sputtering, e-beam or thermal evaporation, molecular beam epitaxy, and cathodic arc discharging, and wherein the chemical vapor deposition comprises atomic layer deposition.

6. The metal coating of claim 1, wherein the first metal layer is deposited by at least one of electroplating, physical vapor deposition, or chemical vapor deposition, wherein the physical deposition comprises at least one of sputtering, e-beam or thermal evaporation, molecular beam epitaxy, and cathodic arc discharging, and wherein the chemical vapor deposition comprises atomic layer deposition.

7. The metal coating of claim 1, further comprising a second plurality of defects grown vertically through the first metal layer as a plurality of incoherent twin boundaries;
   wherein the second plurality of high density nanoscale twin boundaries grown through the first metal layer mirrors the first plurality of high density nanoscale twin boundaries.

8. The metal coating of claim 7, wherein the first plurality of defects comprises at least one of a first plurality of high density nanoscale twin boundaries and a first plurality of stacking faults, and wherein the second plurality of defects comprises at least one of a second plurality of high density nanoscale twin boundaries and a second plurality of stacking faults.

9. The metal coating of claim 1, wherein the first seed layer comprises a low stacking fault energy metal with a stacking fault energy of less than about 100 mJ/m$^2$, wherein the low stacking fault metal comprises least one of silver, copper, gold, and alloys thereof, and wherein the first metal layer comprises a material with a stacking fault energy greater than about 100 mJ/m$^2$.

10. The metal coating of claim 1, wherein each seed layer of the plurality of seed layers has an interplanar spacing difference along at least a portion of a plurality of planes of about less than 3% as compared to each metal layer of the plurality of the metal layers.

11. The metal coating of claim 1, wherein the first plurality of defects comprises at least one of a plurality of coherent twin boundaries and a plurality of incoherent twin boundaries.

12. The metal coating of claim 11, wherein at least some of the incoherent twin boundaries and at least some of the coherent twin boundaries combine to form a plurality of meandering boundaries at the interface of each seed layer and each metal layer.

13. The metal coating of claim 12, wherein the plurality of meandering boundaries form a curved layer interface, and wherein the plurality of coherent twin boundaries propagate across the curved layer interface from the first seed layer to the first metal layer.

14. The metal coating of claim 1, wherein the first seed layer comprises at least one low stacking fault energy metal, wherein the at least one low stacking fault energy metal comprises pure copper, pure silver, pure gold, copper alloys, silver alloys, gold alloys, and combinations thereof, and wherein the first metal layer comprises at least one high stacking fault energy metal, wherein the at least one high stacking fault energy metal comprises pure nickel, pure palladium, pure aluminum, pure platinum, nickel alloys, palladium alloys, aluminum alloys, platinum alloys, and combinations thereof.

15. The metal coating of claim 1, wherein each metal layer of the plurality of metal layers has a higher stacking fault energy than the each seed layer of the plurality of seed layers.

16. A high stacking fault energy metal coating comprising:
   a substrate;
   a plurality of seed layers, wherein a first seed layer of the plurality of seed layers comprises a first material, wherein a second seed layer of the plurality of seed layers comprises a second material, wherein the first seed layer is deposited on the substrate, and wherein the second seed layer is deposited on the first seed layer;

at least a first metal layer of a plurality of metal layers is deposited on the plurality of seed layers;
a first plurality of defects grown at least one of vertically and laterally into the first metal layer, mirroring a first plurality of twin boundaries in the seed layer, and wherein the metal coating has a hardness from about 1 GPa to about 20 GPa;
wherein each metal layer of the plurality of metal layers has a higher stacking fault energy than each seed layer of the plurality of seed layers.

* * * * *